(12) United States Patent
Siebert et al.

(10) Patent No.: US 6,995,077 B2
(45) Date of Patent: *Feb. 7, 2006

(54) EPITAXIALLY COATED SEMICONDUCTOR WAFER AND PROCESS FOR PRODUCING IT

(75) Inventors: Wolfgang Siebert, Mehring (DE); Peter Storck, Mehring (DE)

(73) Assignee: Siltronic AG, Munich (DE)

( * ) Notice: Subject to any disclaimer, the term of this patent is extended or adjusted under 35 U.S.C. 154(b) by 0 days.

This patent is subject to a terminal disclaimer.

(21) Appl. No.: 10/731,034

(22) Filed: Dec. 9, 2003

(65) Prior Publication Data

US 2004/0115941 A1  Jun. 17, 2004

Related U.S. Application Data

(62) Division of application No. 09/716,708, filed on Nov. 20, 2000, now abandoned.

(30) Foreign Application Priority Data

Dec. 16, 1999 (DE) ................................ 199 60 823

(51) Int. Cl.
*H01L 21/20* (2006.01)
(52) U.S. Cl. ............ 438/478; 438/492; 438/503; 438/974
(58) Field of Classification Search ............ 438/478, 438/492, 503, 974
See application file for complete search history.

(56) References Cited

U.S. PATENT DOCUMENTS 5,219,613 A * 6/1993 Fabry et al. ............... 438/758
6,261,362 B1 * 7/2001 Fujikawa et al. ........... 117/20
6,284,384 B1 * 9/2001 Wilson et al. .............. 428/450
6,630,024 B2 * 10/2003 Schmolke et al. .......... 117/106

FOREIGN PATENT DOCUMENTS

| DE | 198 33 257 | 9/1999 |
| DE | 199 05 737 | 8/2000 |
| EP | 0684634 | 11/1995 |
| EP | 0711854 | 5/1996 |

OTHER PUBLICATIONS

English Derwent Abstract AN 2000-579981 [55] corresp. to DE 199 05 737.

(Continued)

*Primary Examiner*—Trung Dang
(74) *Attorney, Agent, or Firm*—Brooks Kushman P.C.

(57) ABSTRACT

A semiconductor wafer with a front surface and a back surface and an epitaxial layer of semiconducting material deposited on the front surface, wherein the surface of the epitaxial layer has a maximum density of 0.14 localized light scatterers per $cm^2$ with a cross section of greater than or equal to 0.12 $\mu m$, and the front surface of the semiconductor wafer, prior to the deposition of the epitaxial layer, has a surface roughness of 0.05 to 0.29 nm RMS, measured by AFM on a 1 $\mu m \times 1 \mu m$ reference area. There is also a process for producing a semiconductor wafer with a front surface and a back surface and an epitaxial layer of semiconducting material deposited on the front surface. The process includes the following: (a) a stock removal polishing step as the only polishing step; (b) cleaning and drying of the semiconductor wafer; (c) pretreatment of the front surface of the semiconductor wafer at a temperature of from 950 to 1250 degrees Celsius in an epitaxy reactor; and (d) deposition of the epitaxial layer on the front surface of the pretreated semiconductor wafer.

13 Claims, 1 Drawing Sheet

OTHER PUBLICATIONS

English Derwent Abstract AN 1999-519699 [44] corresp. to DE 198 33 257.

H.M. Liaw, J.W. Rose, Epitaxial Silicon Technology, Academic Press Inc., Orlando, Florida, 1986, p. 71-73.

* cited by examiner

EPITAXIALLY COATED SEMICONDUCTOR WAFER AND PROCESS FOR PRODUCING IT

CROSS REFERENCE TO RELATED APPLICATIONS

This application is a division of 09/716,708, filed Nov. 20, 2000, now abandoned.

Priority is claimed under 35 U.S.C. 119 of German Patent Application No. 199 60 823.7 filed Dec. 16, 1999. Priority is claimed under 35 U.S.C. §120 of U.S. patent application Ser. No. 09/716,708 filed Nov. 20, 2000 now abandoned.

BACKGROUND OF THE INVENTION

1. Field of the Invention

The present invention relates to a semiconductor wafer with an epitaxial coating on a front surface which has a reduced number of localized light scatterers on the epitaxial layer, and to a cost-effective process for producing it. Semiconductor wafers of this type are suitable for use in the semiconductor industry, in particular for the fabrication of electronic components with line widths of less than or equal to 0.18 $\mu$m.

2. The Prior Art

A semiconductor wafer which is intended to be suitable in particular for the fabrication of electronic components with line widths of less than or equal to 0.18 $\mu$m must have a large number of special properties. Two particularly important properties of semiconductor wafers are the number of localized light scatterers (LLS) and the roughness (haze) on the surface on which semiconductor components are to be produced. When they are present in a certain number and size, LLS can lead to the failure of the components.

Monocrystalline semiconductor wafers with a layer of the same crystal orientation grown as a single crystal is a so-called epitaxial or epitaxially grown layer, on which semiconductor components are applied. For example a silicon wafer with a silicon layer, have certain advantages over semiconductor wafers made of a homogeneous material. Mention may first be made of the so-called latch-up problem, which can occur for example in CMOS circuits on homogeneous material and may lead to voltages in the transistors which may permit charge reversal and effect a short circuit of the component in question. A person skilled in the art is aware that this latch-up problem can be effectively prevented by the use of an epitaxially coated semiconductor wafer made of a heavily doped substrate wafer (low electrical resistance) and a weakly doped epitaxial layer (high resistance). This simultaneously brings about a desired gettering effect of the substrate and, moreover, reduces the area occupied by the component. Furthermore, in comparison with polished semiconductor wafers, epitaxially coated surfaces have a lower defect density, expressed as LLS, which may be so-called COPs (crystal-originated particles), for example, which generally leads to a higher yield of intact semiconductor components. Furthermore, epitaxial layers have no appreciable oxygen content, which precludes the risk of oxygen precipitates that potentially destroy circuits in regions relevant to components.

According to the prior art, epitaxially coated semiconductor wafers are produced from suitable intermediates by the process sequence of abrasive polishing—final polishing—cleaning—epitaxy. In this case, depending on the process control, the surface roughness is approximately 0.5 to 3 nm RMS (root mean square) after the stock removal polishing, measured by the atomic force microscope method (AFM) in a region of 1 $\mu$m×1 $\mu$m, and approximately 0.05 to 0.2 nm RMS after the final polishing. Three- or four-stage polishing processes in which the roughness is progressively reduced are likewise known.

The patent application EP 684 634 A2 describes a variant procedure in which, in the material-removing polishing step, two different polishing fluids of different grain size are supplied one after the other before the semiconductor wafers are subjected to a final polishing step. Multistage polishing processes have the disadvantage that the production costs of the semiconductor wafers rise with each additional step.

The patent application EP 711 854 A1 describes a process for producing an epitaxially coated wafer by subjecting a sawn-lapped-etched silicon wafer to a stock removal polishing step in which a surface roughness of 0.3 to 1.2 nm RMS (AFM, 1 $\mu$m×1 $\mu$m) is established. Then in order to reduce the costs, an epitaxial silicon layer is deposited without a smoothing final polishing step being carried out. Although the epitaxial layer thus produced is comparable in its electrical properties to an epitaxial layer produced conventionally with the prior application of a final polishing step, there is the following result. The increase in localized light scatters on the epitaxially coated surface caused by the relatively high initial roughness nonetheless potentially leads to increased failure of components produced on these wafers.

SUMMARY OF THE INVENTION

Therefore, it is an object of the present invention to provide an epitaxially coated semiconductor wafer which is suitable for the fabrication of electronic components with line widths of less than or equal to 0.18 $\mu$m. This wafer of the invention does not have the abovementioned disadvantages with regard to the number of localized light scatterers on the epitaxially coated surface, and which can be attained by means of a cost-effective production process. Furthermore, the further properties of the epitaxially coated semiconductor wafer should be at least equal to those of the epitaxially coated semiconductor wafers produced according to the prior art.

The present invention relates to a semiconductor wafer with a front surface and a back surface and an epitaxial layer of semiconducting material deposited on the front surface, wherein the surface of the epitaxial layer has a maximum density of 0.14 localized light scatterers per cm$^2$ with a cross section of greater than or equal to 0.12 $\mu$m, and the front surface of the semiconductor wafer, prior to the deposition of the epitaxial layer, has a surface roughness of 0.05 to 0.29 nm RMS, measured by AFM on a 1 $\mu$m×1 $\mu$m reference area.

The present invention also relates to a process for producing a semiconductor wafer with a front surface and a back surface and an epitaxial layer of semiconducting material deposited on the front surface, which comprises the following process steps:

(a) a stock removal polishing step as the only polishing step;

(b) cleaning and drying of the semiconductor wafer;

(c) pretreating of the front surface of the semiconductor wafer at a temperature of from 950 to 1250 degrees Celsius in an epitaxy reactor; and (d) depositing of the epitaxial layer on the front surface of the pretreated semiconductor wafer.

The combination of the process steps (a) to (c) conditions the surface of the front surface of the semiconductor wafer in such a way that the quality of the epitaxial layer which is subsequently grown corresponds at least to the requirements of the prior art with regard to the maximum number of localized light scatterers on the surface of the layer. However, the costs of a semiconductor wafer produced in accordance with process steps (a) to (d) are lower than those of a similar semiconductor wafer produced according to the prior art.

According to step (c) of the process, a semiconductor wafer which has been subjected to only one stock removal polishing step is pretreated in an epitaxy reactor in such a manner that, in a first step, native oxide is removed from the front surface of the semiconductor wafer as a result of the semiconductor wafer being exposed to a hydrogen atmosphere. In a second step, the surface roughness of the front surface of the semiconductor wafer is reduced as a result of gaseous HCl being introduced into the hydrogen atmosphere. In step (d) of the process, the semiconductor wafer which has been pretreated in this way is provided with an epitaxial layer. This epitaxial layer, by virtue of the preceding process steps, is at least the equal of the prior art with regard to the roughness of the epitaxially coated surface and the number of localized light scatterers. Hence this epitaxial layer has the characteristics of similar semiconductor wafers which, however, have been produced using both stock removal polishing and final polishing (finishing).

Treating a semiconductor wafer in an $HCl/H_2$ atmosphere has already been described in a different context (H. M. Liaw and J. W. Rose in: *Epitaxial Silicon Technology*, Academic Press Inc., Orlando Fla. 1986, pages 71–73).

In the process of the invention, the addition of a small amount of gaseous HCl to the hydrogen atmosphere which takes place in accordance with step (c) leads to significant smoothing of the surface of the semiconductor wafer, which has only undergone stock removal polishing. It is thought that the addition of only a small amount of HCl not only leads to silicon being removed by incipient etching, but also to redeposition of volatile chlorosilanes and recrystallization of silicon on the surface. In the process, silicon is moved from highly reactive areas to areas which are more favorable in terms of energy, leading to a considerable reduction in the roughness of the surface. If a higher HCl concentration is present, this effect is no longer observed, owing to the substantial removal of silicon as a result of etching and the associated roughening of the surface.

In principle, the process according to the invention can be used to produce a wafer-like body which is composed of a material which can be machined by the chemical mechanical single-side or double-side polishing process used and can be epitaxially coated. Silicon in monocrystalline form with a crystal orientation (100), (110) or (111), for example crystallized by a Czochralski or a float zone process, is preferred. In this case, the silicon contains a certain amount of dopant, a distinction being made between dopants from the 3rd main group of the Periodic System of the Elements, for example boron, which lead to p-type material, and elements from the 5th main group, for example phosphorus, arsenic or antimony, which lead to n-type material. Silicon or silicon/germanium is preferred as the material for the epitaxial coating. By virtue of its dopant content, the epitaxial coating generally differs in its electrical properties from electrical properties of the semiconductor wafer. However, this is not absolutely necessary. For example, it is also possible to grow an epitaxial layer without any dopant content. Within the scope of the invention, silicon wafers with an epitaxial coating of silicon are particularly preferred, where the silicon wafer and the epitaxial layer are either both of the p-type or both of the n-type.

The process is particularly suitable for the production of silicon wafers with diameters of, in particular, 200 mm, 300 mm, 400 mm and 450 mm and thicknesses of a few 100 $\mu$m to a few cm, preferably 400 $\mu$m to 1200 $\mu$m. The epitaxially coated semiconductor wafers can either be used directly as a starting material for the production of semiconductor components or can be supplied for their intended purpose after the application of back-surface seals or further treatment of the back surface by grinding, etching, polishing, etc., in each case according to the prior art. Of course, the invention can be applied not only to the production of wafers made from a homogeneous material but also to the production of semiconductor substrates constructed in a multilayer manner, such as SOI (silicon-on-insulator) wafers and so-called bonded wafers, although the cost advantage may be lost in this case.

The process is described further using the example of the production of a silicon wafer with an epitaxial coating of silicon on the front surface.

In principle, it is possible for a silicon wafer which has been sawn, for example by means of an annular sawing or wire sawing process, to be subjected directly to the process according to the invention. However, it is expedient and therefore preferred for the sharp, and therefore highly mechanically sensitive edge of the wafer to be rounded with the aid of a suitably profiled grinding wheel. Furthermore, it is possible, in order to improve the geometry and partially abrade the destroyed crystal layers, to subject the silicon wafer to a mechanical abrasion step, such as lapping or grinding, in order to reduce the amount of material removed in the polishing step. It is preferred for the silicon wafer to be subjected to a surface-grinding step, where either one side is ground or both sides are ground sequentially or both sides are ground simultaneously. In order to remove the damage to the wafer surface and edge which has inevitably been produced in the mechanical process steps and in order to remove any impurities which may be present, an etching step may take place at this point. This etching step may be carried out either as a wet-chemical treatment of the silicon wafer in an alkaline or acidic etching mixture or as a plasma treatment. An acid etching step using a mixture of concentrated aqueous nitric acid and concentrated aqueous hydrofluoric acid, for example the embodiment described in the German Patent Application Serial Number 198 33 257.2, is preferred.

A particularly preferred starting material for the process sequence according to the invention is semiconductor wafers made of silicon with a diameter of greater than or equal to 200 mm, produced by sawing a single silicon crystal, followed by edge rounding, sequential surface grinding of both sides of the wafer, removing from 10 $\mu$m to 100 $\mu$m of silicon per side, and wet-chemical etching in an acidic etching mixture, removing from 5 $\mu$m to 50 $\mu$m of silicon per side of the wafer.

Step (a) of the process sequence according to the invention:

To produce the epitaxially coated semiconductor wafers according to the invention, the wafers are subjected to only one stock removal polishing step, the polishing being carried out either on both sides simultaneously or on only one side of the wafer. A suitable polishing process for wafers which have been polished on two sides is described, for example, in the patent application Ser. No. 199 05 737.0.

Step (b) of the process sequence according to the invention:

After the polishing step (a), the silicon wafers are removed from the polishing machine and subjected to cleaning and drying according to the prior art. The cleaning may be carried out either as a batch process with a multiplicity of wafers being cleaned simultaneously in baths or using a spray method, or as a single-wafer process.

Step (c) of the process sequence according to the invention:

The silicon wafers which have been treated as described in steps (a) and (b) are then subjected to a pretreatment in a reactor, which is also used for the subsequent epitaxial deposition of a silicon layer. During this pretreatment firstly the native oxide is removed from the surface, and then the surface roughness which is still present after the stock removal polishing is significantly reduced. The oxide is removed in a pure hydrogen atmosphere in a temperature range of from 950 to 1200 degrees Celsius, with a temperature range of from 1100 to 1150 degrees being preferred. The hydrogen flow rate is in a range from 1 to 100 SLM, preferably 50 SLM. The surface roughness is reduced by the addition of gaseous HCl to the hydrogen atmosphere at a temperature of from 950 to 1200 degrees Celsius, preferably 1100 to 1180 degrees Celsius, and particularly preferably at 1140 degrees Celsius. The concentration of the gaseous HCl is kept at such a low level that the etching rate is in a range from 0.01 $\mu$m/min to 0.1 $\mu$m/min, the amount of material removed by etching being in a range from 0.01 to 0.2 $\mu$m, preferably from 0.01 to less than 0.1 $\mu$m.

Step (d) of the process sequence according to the invention:

The silicon wafers that have been treated in accordance with steps (a) to (c) are provided with an epitaxial silicon layer on at least the front surface according to standard processes. This is preferably done using the CVD (chemical vapor deposition) process, in which silanes, for example silane ($SiH_4$), dichlorosilane ($SiH_2Cl_2$), trichlorosilane ($SiHCl_3$) or tetrachlorosilane ($SiCl_4$), are passed to the wafer surface, where they decompose to form elemental silicon and volatile byproducts at temperatures of from 600° C. to 1250° C. and form an epitaxial, that is to say monocrystalline, silicon layer grown in a crystallographically oriented manner on the semiconductor wafer. Silicon layers having a thickness of from 0.3 $\mu$m to 10 $\mu$m are preferred. The epitaxial layer may be undoped or doped in a targeted manner, for example with boron, phosphorus, arsenic or antimony, in order to set the conduction type and the desired conductivity.

After the epitaxial coating of at least the front surface of the semiconductor wafer has been carried out, preferably with silicon, a semiconductor wafer according to the invention is present which has a hydrophobic surface and can be supplied in this form for further processing for the purpose of producing integrated components. However, it is possible, although not absolutely necessary within the scope of the invention, to render the wafer surface hydrophilic in order to provide protection against contamination. That is to coat it with a thin oxide layer, for example an oxide layer having a thickness of approximately 1 nm, which is known as "native oxide" to the person skilled in the art. In principle, this can be done in two different ways: on the one hand, the surface of the epitaxially coated semiconductor wafer can be treated with an oxidative gas, for example ozone, which can be carried out in the epitaxy chamber itself or in a separate installation. On the other hand, it is possible to render the surface hydrophilic in a bath installation with a bath sequence of the RCA type, followed by drying of the wafers.

After the process sequence (a) to (d) according to the invention has been carried out, semiconductor wafers which have been epitaxially coated at least on the front surface and have a haze-free surface are present. These wafers, before they are subjected to further processing for the purpose of producing semiconductor components, can be supplied to a stage for characterization of their properties. Measurements using an optical surface inspection apparatus of laser-based operation show a maximum density of 0.14 local light scatterers per $cm^2$ of epitaxially coated wafer surface and a surface roughness (haze) of less than 0.2 ppm.

If necessary, a laser-marking step for the purpose of identifying the wafer and/or an edge-polishing step may be added at a suitable point in the process sequence, for example before or after grinding in the case of laser marking and before, during or after double-side polishing in the case of edge polishing. A series of further process steps which are required for certain products, such as for example the application of back-surface coatings of polysilicon, silicon dioxide and/or silicon nitride, can likewise be incorporated into the process sequence at the suitable points according to methods which are known to the person skilled in the art. Furthermore, it may also be desirable for the semiconductor wafer to be subjected to batch cleaning or individual-wafer cleaning according to the prior art and before or after individual process steps.

With regard to the further parameters which are customarily used to characterize wafers, they are well known to the person skilled in the art. These further parameters include for example metal contamination of the surface of the wafers and minority charge carrier lifetime, and also nanotopological properties. However, an epitaxially coated semiconductor wafer produced according to the invention has no disadvantages compared to an epitaxially coated semiconductor wafer which is produced according to the prior art with the application of a final polishing step prior to the deposition of the epitaxial layer.

An epitaxially coated semiconductor wafer produced according to the invention, in particular a silicon wafer with an epitaxial silicon coating, fulfills the requirements for the production of semiconductor components with line widths of less than or equal to 0.18 $\mu$m. The process according to the invention has proved to be an optimum solution for the production of epitaxially coated silicon wafers having the features outlined above. The geometry requirements imposed on the starting material are minimal, which reduces the demands imposed on the preliminary processes. The excellent wafer geometry which is obtained in the two-sided polishing is produced even after relatively little material has been removed. By virtue of the enhanced process reliability, together with a reduced risk of fracture, the wafers of the invention are produced in very high yields without cost-intensive steps for local geometry correction, for example by plasma etching, being necessary. This excellent wafer geometry is also completely preserved on the end product according to the invention as a result of the need to carry out a final polishing step being obviated.

DETAILED DESCRIPTION OF PREFERRED EMBODIMENTS

Figure 1:
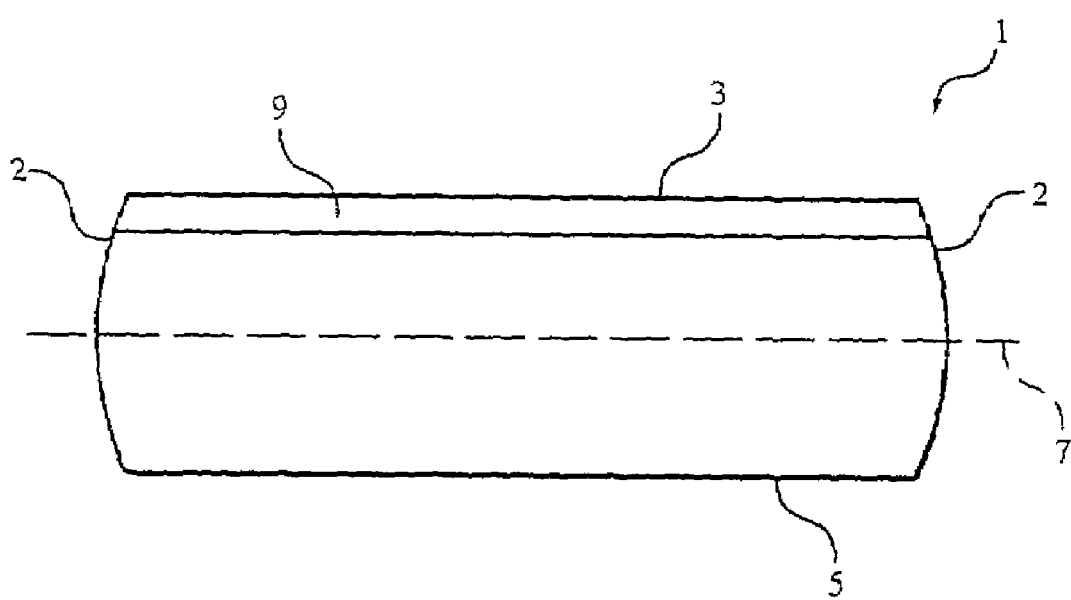
FIG. 1 shows a silicon single wafer according to the invention.

The present invention will now be further described by reference to the following examples which are not to be deemed limitative of the present invention in any manner thereof.

All the examples and comparative examples described below relate to the production of silicon wafers with a diameter of (300±0.2) mm, an oxygen content of $(6\pm1)\cdot10^{17}$ atoms/cm$^3$, and a boron doping which leads to a resistance in the range from 5 to 20 mΩ·cm, and which have an epitaxial silicon layer on the front surface with a boron doping which leads to a resistance in the range from 1 to 10 Ω·cm.

Referring to FIG. 1, the semiconductor wafer 1 preferably has a front surface 3, a back surface 5, an imaginary central plane 7 between the front and back surfaces, and a circumferential edge 2 joining the front surface 3 and the back surface 5. The terms "front" and "back" in this context are used to distinguish the two major, generally planar surfaces of the wafer 1. There is an epitaxial layer 9 on the front surface 3 of the pretreated semiconductor wafer 1.

EXAMPLE (INVENTION)

300 mm silicon wafers with double-side polished surface, which had been polished and cleaned as described in steps (a) and (b), were available for this example. The roughness of the prepolished wafer was 0.7 nm RMS (AFM, 1 µm×1 µm).

Step (c): the front surface of the semiconductor wafers was then subjected to a pretreatment prior to the epitaxial coating in the epitaxy reactor, with the aim of, in a first step, removing the native oxide on the front surface and, in a second step, drastically reducing the roughness on the surface, so that after epitaxial coating a semiconductor wafer with considerably improved properties in terms of surface roughness and number of localized light scatterers is available. This was achieved by the fact that, firstly, the native oxide was removed in a hydrogen atmosphere at 1120 degrees Celsius for one minute. Then, gaseous HCl was added to the hydrogen atmosphere for one minute at a temperature of 1140 degrees Celsius, with the aim of significantly reducing the roughness which is still present on the front surface. The etching rate was less than 0.04 µm/min, and the amount of material removed by etching was 0.04 µm. After this pretreatment according to the invention, the wafers had a surface roughness of approximately 0.17 nm RMS (AFM, 1 µm×1 µm).

Step (d): the semiconductor wafers which had been pretreated as described in step (c) were then provided with an epitaxially grown silicon layer on the front surface in the epitaxy reactor, where SiHCl$_3$ was used as the silicon component and the resistance was set by doping with diborane, B$_2$H$_6$. At a reactor chamber temperature of 1140° C., a layer having a thickness of 3.2 µm was deposited at a deposition rate of 3 µm/min.

Characterization of the epitaxially coated silicon wafers:

The silicon wafers that had been epitaxially coated with silicon on the front surface were characterized with respect to their defects on the epitaxially coated front surface on a surface inspection apparatus of the SP1 type from KLA-Tencor operating according to the laser principle. The total number of LLS defects greater than or equal to 0.12 µm, with a mean value of 22±15, corresponded to (0.03±0.02) LLS/cm$^2$. This resulted in the DWN "dark field wide" channel, and the haze value was 0.06±0.03 ppm.

Comparative Example 1

The procedure utilized was that the wafers which had been polished on two sides in accordance with the method described in (a), after cleaning and drying, had a roughness of 0.7 nm RMS (AFM, 1 µm×1 µm). Without the pretreatment described for the invention, following the epitaxial coating on the front surface, a mean value for the LLS defects greater than or equal to 0.12 µm in the DWN channel was 368±124, corresponding to (0.52±0.18) LLS/cm$^2$ was found. The haze value was 0.09±0.04 ppm.

Comparative Example 2

The procedure used was that the double-side polished wafers described in Comparative Example 1 were subjected to a pretreatment in the epitaxy reactor, where the HCl concentration was so high that the etching rate was 2 µm/min and a total of 2 µm of material was etched off the surface. Following epitaxial deposition of silicon, the following measured valves were obtained: mean LLS defect number on front surface greater than or equal to 0.12 µm in the DWN channel was 150±45, corresponding to (0.21±0.06) LLS/cm$^2$. The haze value was 1.2±0.4 ppm.

Further characterization of the wafers produced is as follows. The front surfaces, back surfaces and edges of the 300 mm silicon wafers produced according to the Example (Invention) and the two Comparative Examples were characterized with respect to metal contamination of the wafer surface and minority charge carrier lifetime and also nano-topological properties, using the standard methods which are known to the person skilled in the art. No statistically relevant deviations were observed between the Wafers of the Invention and the individual Comparative Examples test groups.

Accordingly, while a few embodiments of the present invention have been shown and described, it is to be understood that many changes and modifications may be made thereunto without departing from the spirit and scope of the invention as defined in the appended claims.

What is claimed is:

1. A process for producing a semiconductor wafer with a front surface and a back surface and an epitaxial layer of semiconducting material deposited on the front surface, wherein the process comprises the following process steps:
    a) a stock removal polishing step as the only polishing step:
    b) cleaning and drying of the semiconductor wafer;
    c) pretreating of the front surface of the semiconductor wafer in a first step in a hydrogen atmosphere at a temperature of 950° C. to 1250° C. to remove oxide from the front surface of the wafer, and then, in a second step, with a mixture of hydrogen and HCl at a temperature of from 950° C. to 1250° C. to selectively etch said front surface and remove from 0.01 to 0.2 µm of material from the front surface of the semiconductor wafer at an etching rate of 0.01 to 0.1 µm/min; and
    d) depositing an epitaxial layer on the front surface of the pretreated semiconductor wafer.

2. The process of claim 1, comprising
polishing the front surface and the back surface of the semiconductor wafer simultaneously during the stock removal polishing.

3. The process of claim 1, comprising
polishing only the front surface of the semiconductor wafer during the stock removal polishing.

4. The process as claimed in claim 1, comprising
carrying out the pretreating referred to in step (c) immediately before depositing the epitaxial layer.

5. The process of claim 1, comprising
treating the semiconductor wafer, in a first step of the pretreating according to step (c), in a hydrogen atmosphere at a temperature of from 1100 to 1150 degrees Celsius.

6. The process of claim 1, wherein the epitaxial layer deposited in step (d) has a thickness of 0.3 µm to 10 µm and is deposited at a temperature of from 600° C. to 1250° C.

7. The process of claim 1, wherein the epitaxial layer deposited in step (d) is rendered hydrophilic using an oxidizing gas.

8. The process of claim 1, wherein the epitaxial layer deposited in step (d) is rendered hydrophilic by wet-chemical means.

9. A process for preparation of an epitaxially coated silicon wafer having a front surface and a back surface, comprising
a) polishing at least the front surface of a silicon wafer in a single removal polishing step to produce a polished silicon wafer having a polished front surface with a surface roughness of 0.05 to 0.29 nm RMS over 1 µm×1 µm;
b) cleaning and drying the polished silicon wafer;
c) thermally treating the polished silicon wafer by
 c)i) in a first step, removing native oxide by treating with $H_2$ at a temperature of 950° C. to 1200° C.; and
 c)ii) subsequently etching the polished silicon wafer in a mixture of $H_2$ and gaseous HCl at a temperature of from 1100° C. to 1180° C. to remove 0.01 to 0.2 µm of silicon from said front surface, the concentration of HCl such that the etch rate is from 0.01 to 0.1 µm/min; and
d) depositing an epitaxial layer onto said front surface.

10. The process of claim 9, wherein step c)i) is performed at a temperature of 1100° C. to 1150° C.

11. The process of claim 9, wherein said silicon wafer is a boron-doped silicon wafer.

12. The process of claim 9, wherein said silicon wafer is an n-type silicon wafer doped with at least one of phosphorus, arsenic, or antimony.

13. A process for producing a semiconductor wafer with a front surface and a back surface and an epitaxial layer of semiconducting material deposited on the front surface, wherein the process comprises the following process steps:
a) a stock removal polishing step as the only polishing step:
b) cleaning and drying of the semiconductor wafer;
c) pretreating of the front surface of the semiconductor wafer in a first step in a hydrogen atmosphere at a temperature of 950° C. to 1250° C. to remove oxide from the front surface of the wafer, and then, in a second step, with a mixture of hydrogen and HCl at a temperature of from 950° C. to 1250° C. to selectively etch said front surface and remove from 0.01 to 0.2 µm of material from the front surface of the semiconductor wafer at an etching rate of 0.01 to 0.1 µm/min;
d) depositing an epitaxial layer on the front surface of the pretreated semiconductor wafer; and
e) further processing said semiconductor wafer into an integrated semiconductor components.

* * * * *